(12) United States Patent
Takeuchi et al.

(10) Patent No.: US 6,838,333 B2
(45) Date of Patent: Jan. 4, 2005

(54) SEMICONDUCTOR MEMORY DEVICE AND METHOD OF PRODUCING THE SAME

(75) Inventors: Hideki Takeuchi, Chiyoda-ku (JP); Hirohiko Izumi, Chiyoda-ku (JP)

(73) Assignee: United Microelectronics Corporation, San Francisco, CA (US)

( * ) Notice: Subject to any disclaimer, the term of this patent is extended or adjusted under 35 U.S.C. 154(b) by 77 days.

(21) Appl. No.: 10/114,989

(22) Filed: Apr. 4, 2002

(65) Prior Publication Data

US 2002/0106854 A1 Aug. 8, 2002

Related U.S. Application Data

(62) Division of application No. 09/110,252, filed on Jul. 6, 1998, now Pat. No. 6,392,264.

(30) Foreign Application Priority Data

Jul. 8, 1997 (JP) ............................................. 9-197763

(51) Int. Cl.[7] .......................................... H01L 21/8242
(52) U.S. Cl. ........................ 438/240; 438/244; 438/387
(58) Field of Search ................................. 438/240, 244, 438/250, 251, 253, 254, 387, 393, 394, 396, 397

(56) References Cited

U.S. PATENT DOCUMENTS

| | | | | |
|---|---|---|---|---|
| 5,126,280 A | * | 6/1992 | Chan et al. ................. | 438/253 |
| 5,155,057 A | * | 10/1992 | Dennison et al. ............ | 438/254 |
| 5,236,855 A | * | 8/1993 | Dennison et al. ............ | 438/397 |
| 5,491,356 A | * | 2/1996 | Dennison et al. ............ | 257/306 |
| 5,508,953 A | * | 4/1996 | Fukuda et al. .............. | 365/145 |
| 5,576,928 A | | 11/1996 | Summerfelt ................. | 257/295 |
| 5,828,092 A | | 10/1998 | Tempel ....................... | 257/295 |
| 5,869,382 A | * | 2/1999 | Kubota ....................... | 438/396 |
| 5,872,373 A | | 2/1999 | Itoh ........................... | 257/295 |
| 5,986,301 A | | 11/1999 | Fukushima ................. | 257/295 |
| 6,323,080 B1 | * | 11/2001 | Parekh ....................... | 438/238 |

FOREIGN PATENT DOCUMENTS

| | | | | | |
|---|---|---|---|---|---|
| DE | 19624698 a | * | 6/1996 | ......... | H01L/27/108 |
| JP | 09017968 A | | 1/1997 | ......... | H01L/27/108 |

* cited by examiner

*Primary Examiner*—Paul E Brock, II
(74) *Attorney, Agent, or Firm*—Connoly Bove Lodge & Hutz LLP; Myron K. Wyche

(57) ABSTRACT

A semiconductor memory device has access transistors with a gate and a pair of impurity diffusion layers formed on a semiconductor substrate and memory capacitors with a storage node electrode and a cell plate electrode. The electrodes are connected to each other via a capacitive insulating layer made of a ferroelectric material. The storage node electrode has a surface covered with the capacitive insulating layer and is formed in a shape of column on one of the pair of impurity diffusion layers in a hole formed from an inter-layer insulating film covering the access transistor to the one of the pair of impurity diffusion layers. A upper surface of the column does not exceed the inter-layer insulating film. The storage node electrode formed in the hole face the cell plate electrode via the inter-layer insulating film.

4 Claims, 7 Drawing Sheets

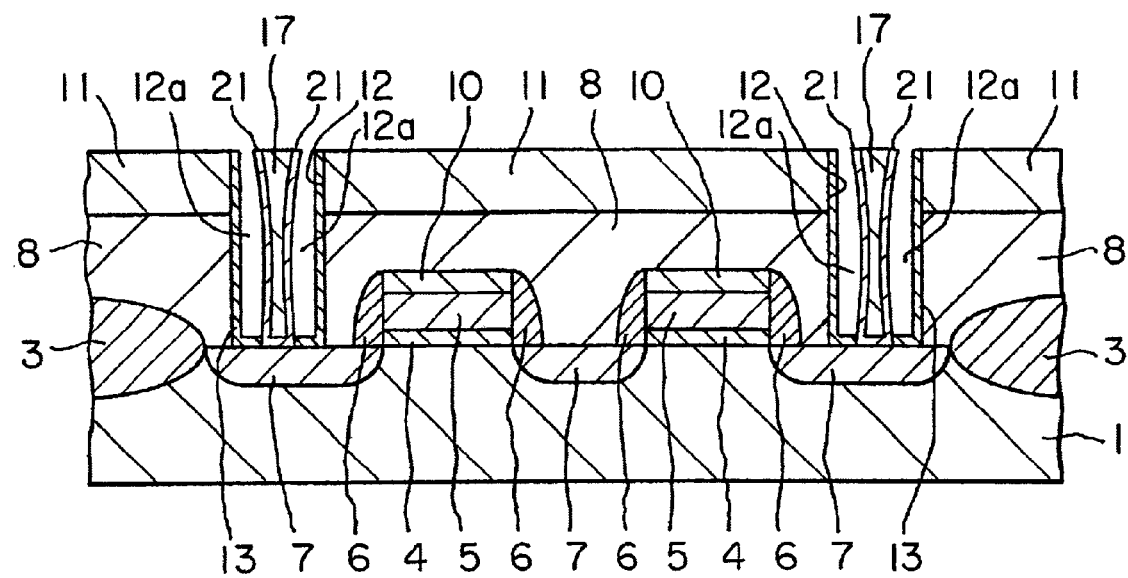
F I G. 11
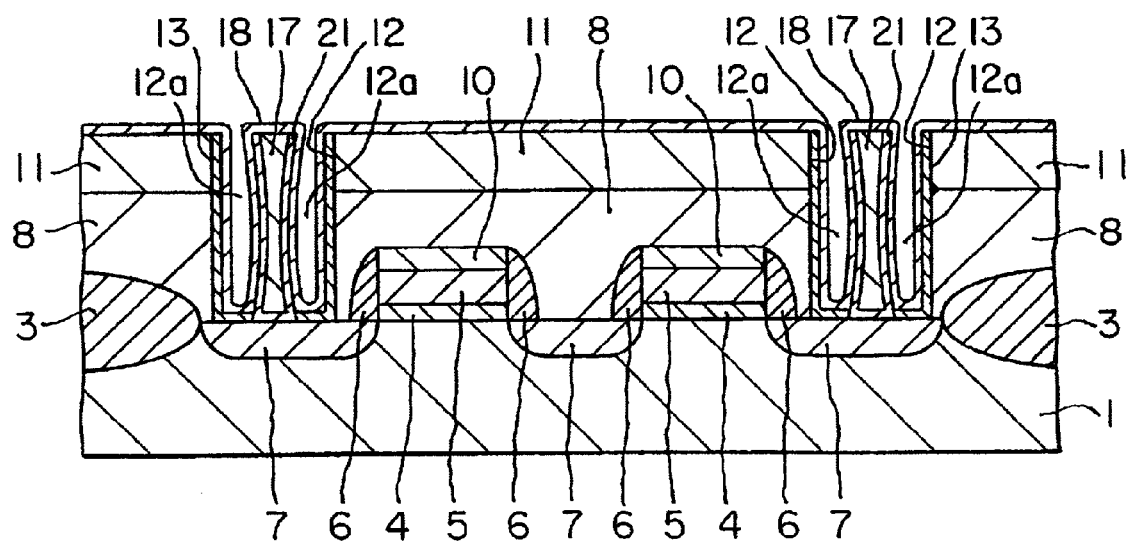
F I G. 12

SEMICONDUCTOR MEMORY DEVICE AND METHOD OF PRODUCING THE SAME

CROSS-REFERENCE TO RELATED APPLICATIONS

This application is a Divisional application of U.S. application Ser. No. 09/110,252 now U.S. Pat. No. 6,392,264 by Hideki Takeuchi filed Jul. 6, 1998 for "SEMICONDUCTOR MEMORY DEVICE AND METHOD OF PRODUCING THE SAME", the entire contents of which are hereby incorporated by reference, and for which domestic priority is claimed under 35 U.S.C. §120, and for which foreign priority is claimed under 35 U.S.C. §119 for Japanese patent application 197763/1997 filed Jul. 8, 1997.

BACKGROUND OF THE INVENTION

The present invention relates to a semiconductor memory device and a method of producing the semiconductor memory device. Particularly, this invention relates to a semiconductor memory device with memory capacitors, such as, a dynamic random-access memory (DRAM) and its production method.

Miniaturization and high integration of semiconductors have been developed. With such development, DRAMs, as one of semiconductor memory devices, are provided with stacked memory capacitors. The memory capacitors consist of a storage node electrode and a cell plate electrode arranged as facing each other via a dielectric film for achieving large practical memory cell capacitance. In other words, the memory cell capacitance is decided according to an area where the storage node and cell plate electrodes face each other. Japanese Laid-Open Patent No. 1997(9)-17968, for example, discloses a technique for achieving a large storage node electrode surface area of a memory capacitor. It is disclosed that: a storage node electrode is formed so that it expands over a storage node contact hole with a dielectric film formed on the surface of the storage node electrode to cover thereof inside and outside the storage node contact hole; and a cell plate electrode is formed over the storage node electrode also to cover thereof inside and outside the storage node contact hole. This technique achieves a large memory capacitance by increasing an area where the storage node and cell plate electrodes face each other even in the storage node contact hole.

Stacked memory capacitors have, however, had an area which has been reduced with development of miniturization and integration, whereas a demand for high capacitive storage capability has not been changed. Storage node electrodes must be formed thick enough to have effective large area where storage node and cell plate electrodes face each other to meet the requirement of high capacitive storage capability under the trend of miniturization and integration. Thick storage electrodes, however, produce tall memory capacitors that cause big steps between memory cells and peripheral circuitry. These steps generate inadequate photolithography in later processes.

In this respect, Japanese Laid-Open Patent No. 1997(9)-17968 discloses a storage node electrode formed so that it expands over a storage node contact hole as discussed above and since that is essential this Laid-Open patent cannot avoid the problem of steps formed between memory cells and peripheral circuitry as discussed above. Hence, the technique taught by this Laid-Open patent cannot meet the requirement of miniaturization and integration in future semiconductor devices.

SUMMARY OF THE INVENTION

A purpose of the present invention is to provide a semiconductor memory device, and a method of producing such device with small and low capacitors, however, with a large capacitance to avoid a problem of step formation as discussed above.

The present invention provides a semiconductor memory device comprising: at least an access transistor having a gate and a pair of impurity diffusion layers formed on a semiconductor substrate; and at least a memory capacitor having a storage node electrode and a cell plate electrode, the electrodes being connected to each other via a capacitive insulating layer made of a ferroelectric material, the storage node electrode having a surface covered with the capacitive insulating layer, the storage node electrode being formed in a shape of column on one of the pair of impurity diffusion layers in a hole formed from an inter-layer insulating film covering the access transistor to the one of the pair of impurity diffusion layers, a upper surface of the column not exceeding the inter-layer insulating film, the storage node electrode formed in the hole facing the cell plate electrode via the inter-layer insulating film.

Further, the present invention provides a semiconductor memory device comprising: a semiconductor area formed on a semiconductor substrate; an inter-layer insulating layer deposited on the semiconductor area, the inter-layer insulating layer having a hole thorough which a portion of a surface of the semiconductor area is exposed; a first conductive layer formed in a shape of column in the hole, a upper surface of the column not exceeding the inter-layer insulating film; a capacitive insulating film made of a ferroelectric material, the capacitive insulating film covering the first conductive film in the hole; and a second conductive film being elongated on the inter-layer insulating film, a space between the capacitive insulating layer and a side face of the hole being filled with the second conductive film to cover the first conductive film via the capacitive insulating film in the hole, thus having capacitive coupling with the first conductive film.

Further, the present invention provides a method of producing a semiconductor memory device provided with at least an access transistor having a gate and a pair of impurity diffusion layers, and at least a memory capacitor having a storage node electrode and a cell plate electrode, the electrodes being connected to each other by capacitive coupling via a dielectric film, the method comprising the steps of: forming a first insulating film that covers the access transistor; forming a hole by patterning the first insulating film to expose a portion of a surface of one of the pair of the impurity diffusion layers through the hole; forming a second insulating layer that covers an inner side wall of the hole; forming a first conductive film on the first insulating film so that the hole is filled with the first conductive film via the second insulating film; having the first conductive film remained in the hole by removing the first conductive film on the first insulating film so that the second insulating film is exposed; forming the storage node electrode by removing the second insulating film to form a space between the first conductive film and the inner wall of the hole and having the first conductive film remained so that the storage node electrode is formed in a shape of column on the one of the pair of the impurity diffusion layers in the hole and a upper surface of the column does not exceed the first insulating film; forming the dielectric film made of a ferroelectric material to cover a surface of the storage node electrode; forming a second conductive film on the first insulating film so that the space in the hole is filled with the second conductive film; and forming a cell plate electrode on the first insulating film so that the cell plate electrode covers the storage node electrode via the dielectric film by processing the second conductive film.

BRIEF DESCRIPTION OF THE DRAWINGS

FIG. 11 is a schematic sectional view explaining a step of a modification of the embodiment of producing process of the DRAM shown in FIG. 1 according to the present invention;

FIG. 12 is a schematic sectional view explaining a step of the modification of producing process of the DRAM shown in FIG. 1.

DETAILED DESCRIPTION OF PREFERRED EMBODIMENTS

Preferred embodiments of the semiconductor memory device and a method of producing the device will be described with reference to the attached drawings.

Figure 1:
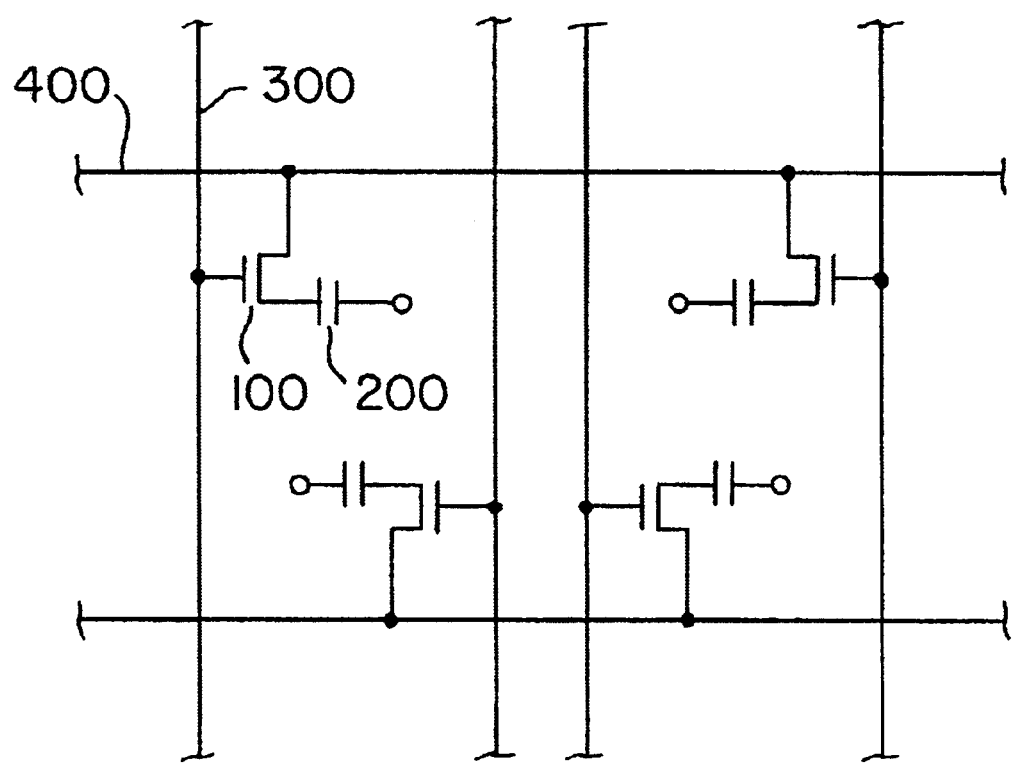
FIG. 1 is a preferred embodiment of a schematic DRAM circuit according to the present invention.

FIG. 1 shows a DRAM of capacitor over bitline (COB) configuration with access transistors 100 and memory capacitors 200. Each memory capacitor 200 is formed on a upper layer of a bit line 400 that crosses a word line 300.

A method of producing the DRAM shown in FIG. 1 will be described with reference to FIGS. 2 to 13.

Figure 2:
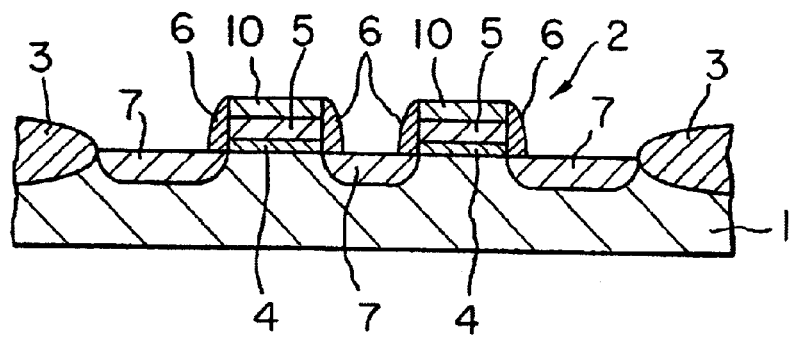
FIG. 2 is a schematic sectional view explaining a step of a preferred embodiment of producing process of the DRAM shown in FIG. 1 according to the present invention.

First, as shown in FIG. 2, field oxide films 3 are formed on a semiconductor substrate 1 of, for example, P-type silicon by local oxidation (LOCOS) to position device forming areas 2 in a device separating structure. In stead of the device separating structure with the field oxide films 3, a field shield device separating structure can be employed in which a conductive film embedded in an insulating film makes a portion of the semiconductor substrate 1 just below the conductive film at a specific potential. Or, shallow trench device separating structure may be employed in which insulators are embedded in trenches formed on the semiconductor substrate 1.

Next, a silicon oxide film is formed on a portion of the semiconductor substrate 1 in each of the device forming areas 2 which have been separated from each other by the field oxide films 3 and positioned relatively by applying thermal oxidation to that portion of the semiconductor substrate 1. On the silicon oxide film, a polycrystalline silicon film with impurities doped by chemical vapor deposition (CVD) and a silicon oxide film are stacked in order.

The silicon oxide film, and the stacked polycrystalline silicon film and silicon oxide film are then patterned by photolithography and the succeeding dry etching to have the three films remained in each device forming area 2 in a shape of electrode to form gate oxide films 4, gate electrodes 5 and cap insulating films 10.

Or, is also preferable that a tungsten suicide film and a silicon oxide film are stacked in order on the polycrystalline silicon film, and the silicon oxide film, polycrystalline silicon film, tungsten silicide and silicon oxide film are patterned by photolithography and the succeeding dry etching to form polycide gate electrodes.

Photoresist used for the patterning is removed by baking and then a silicon oxide film is deposited by CVD over the cap insulating film 10 on the semiconductor substrate 1. The silicon oxide film is then etched by anisotropic etching at its entire surface to have the silicon oxide film remained only on the sides of each gate oxide film 4, gate electrode 5 and the cap insulating film 10 to form side walls 6.

Impurities are doped into the semiconductor substrate 1 via both sides of each gate electrode 5 with side wall 6 and cap insulating film 10 as a mask by ion implantation to form a pair of impurity diffusion layers 7 that will become a source and a drain. The ion implantation is conducted with the dopant dose in the range of $10^{14}/cm^2$ to $10^{15}/cm^2$ by the acceleration energy at a voltage in the range of 30 keV to 150 keV. Through these steps, each access transistor 100 shown in FIG. 1 is completed with the gate electrode 5 and the pair of impurity diffusion layers 7.

Figure 3:
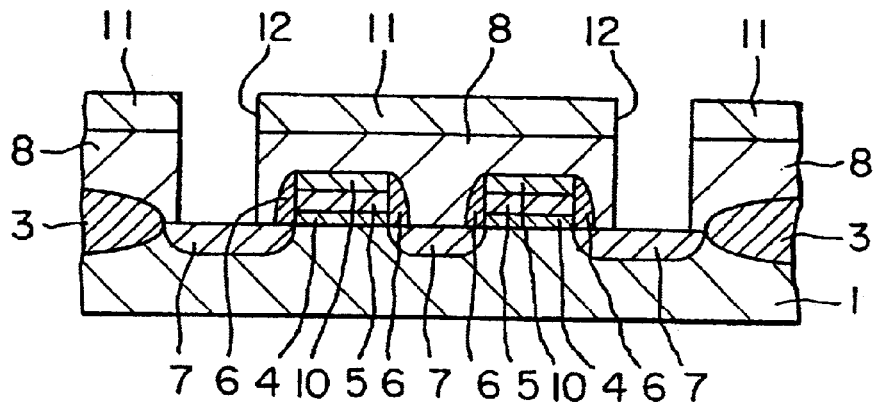
FIG. 3 is a schematic sectional view explaining a step of the embodiment of producing process of the DRAM shown in FIG. 1.

Next, as shown in FIG. 3, an inter-layer insulating film 8 is formed by CVD to deposit borophosphosilicate (BPSG), etc., over the semiconductor substrate 1 with the field oxide film 3. The bit line 400 shown in FIG. 1 is patterned on the inter-layer insulating film 8 so that the bit line 400 is connected to one (a drain) of the impurity diffusion layers 7. On the inter-layer insulating film 8 and the bit line 400, another 500 nm-thick inter-layer insulating film 11 made of silicon oxide film is formed by CVD. The inter-layer insulating films 8 and 11 are then patterned by photolithography and the succeeding dry etching to form storage contacts 12 that make a portion of the surface of the other (a source) impurity diffusion layer 7 of each access transistor 100 be exposed. The storage contacts 12 are formed with depth in the range of about 0.5 µm to 1.0 µm.

Figure 4:
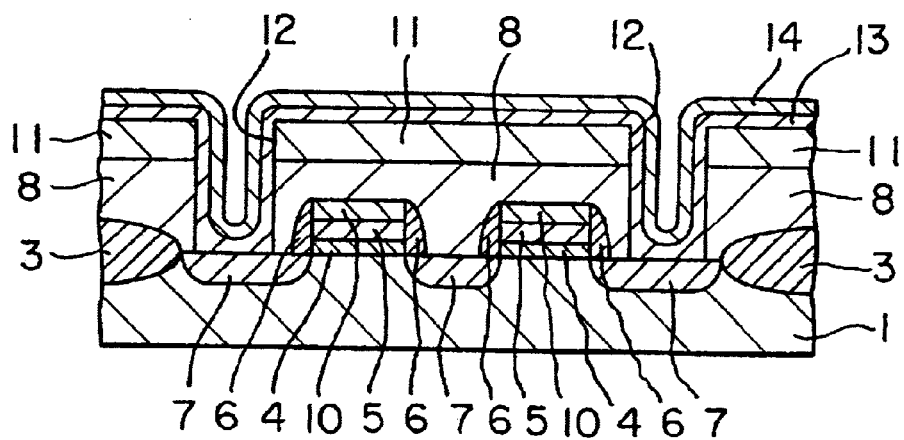
FIG. 4 is a schematic sectional view explaining a step of the embodiment of producing process of the DRAM shown in FIG. 1.

Next, as shown in FIG. 4, a about 10 nm-thick silicon nitride film 13 and a silicon oxide film 14 with thickness in the range of about 20 nm to 50 nm are formed in order by CVD over the inter-layer insulating film 11 and the inner wall of each storage contact 12.

Figure 5:
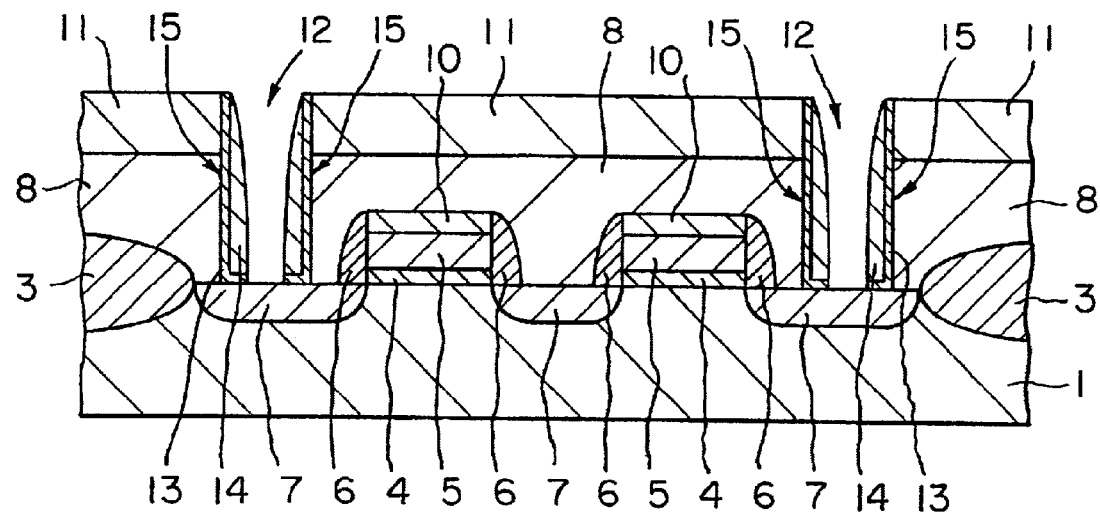
FIG. 5 is a schematic sectional view explaining a step of the embodiment of producing process of the DRAM shown in FIG. 1.

Following this, as shown in FIG. 5, the silicon oxide film 14 and the silicon nitride film 13 are etched by anisotropic dry etching until the surface if the inter-layer insulating film 8 is exposed except the storage contacts 12 to expose again a portion of the impurity diffusion layer 7 as the source and to have the silicon nitride film 13 and the silicon oxide film 14 remained only at the side walls of the storage contacts 12 to form side walls 15. As disclosed later, since the side walls 15 will be removed, a BPSG film may be formed instead of the silicon oxide film 14 in consideration of a wet etching rate to form side walls made of the BPSG film through the same steps.

Figure 6:
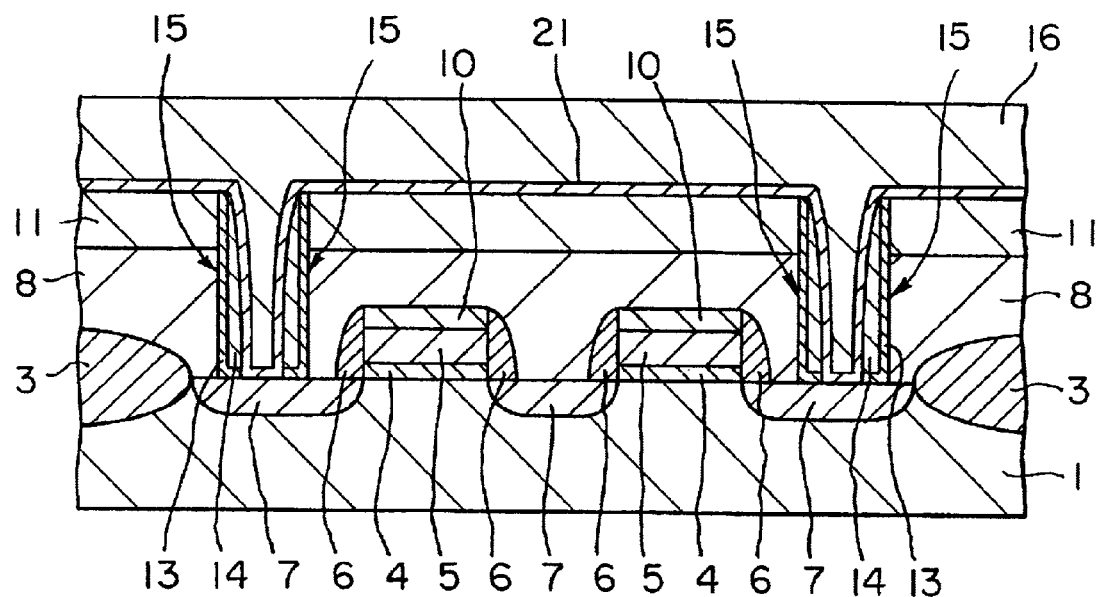
FIG. 6 is a schematic sectional view explaining a step of the embodiment of producing process of the DRAM shown in FIG. 1.

Next, as shown in FIG. 6, by sputtering or CVD, a two-layer film 21 of titanium nitride and titan (TiN/Ti) of thickness in the range of about 50 nm to 100 nm is formed over the semiconductor substrate 1 including the side walls 15 in the storage contacts 12. In FIG. 6, the two-layer film 21 is depicted as one layer for brevity. A tungsten film 16 with thickness of about 500 nm is then formed by CVD to be embedded in the storage contacts 12 via two-layer film 21. Instead of the tungsten film 16 as a high melting point metal, a conductive film may be formed of polycrystalline silicon. Further, instead of the two-layer film 21 of TiN/Ti, a conductive film may be formed of platinum as a high melting point metal, or tungsten nitride, titanium nitride, tungsten carbide, and ruthenium oxide as a compound of a high melting point metal, and so on.

Figure 7:
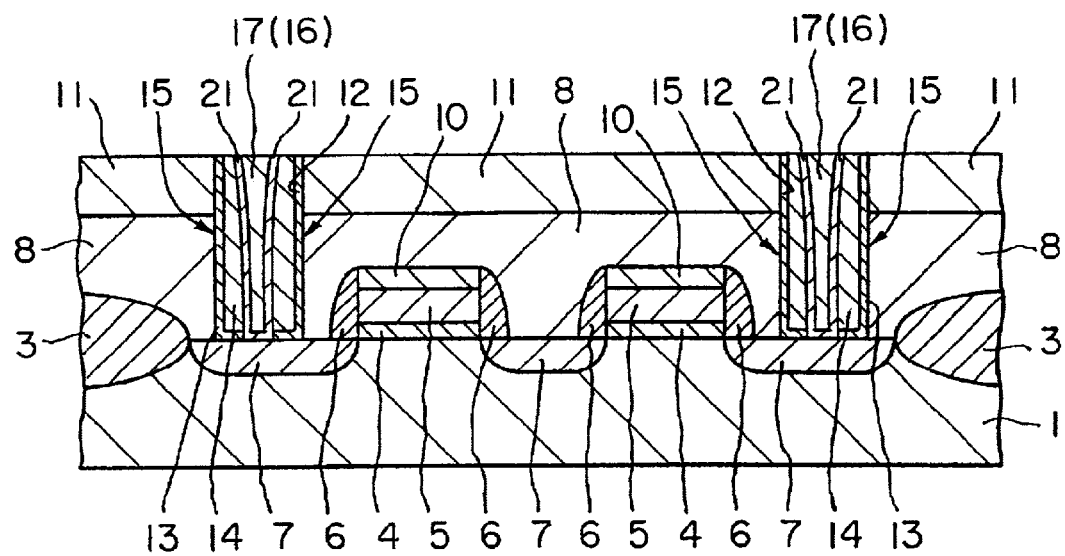
FIG. 7 is a schematic sectional view explaining a step of the embodiment of producing process of the DRAM shown in FIG. 1.

Following to this, as shown in FIG. 7, the tungsten film 16 is polished by chemical mechanical polishing (CMP) until a portion of each side wall 15 is exposed to have the tungsten film 16 remained in each storage contact 12. By this step, column-like storage node electrodes 17 are formed by self-alignment with patterning. Each storage node electrode 17 is a lower electrode of the memory capacitor 200 connected to the impurity diffusion film 7 as the source in each storage contact 12. In detail, the storage node electrodes 17 are formed on the impurity diffusion film 17 via two-layer film 21 like a circular conic the cross section of which becomes larger as close to the top from the bottom of the storage node electrodes 17.

Figure 8:
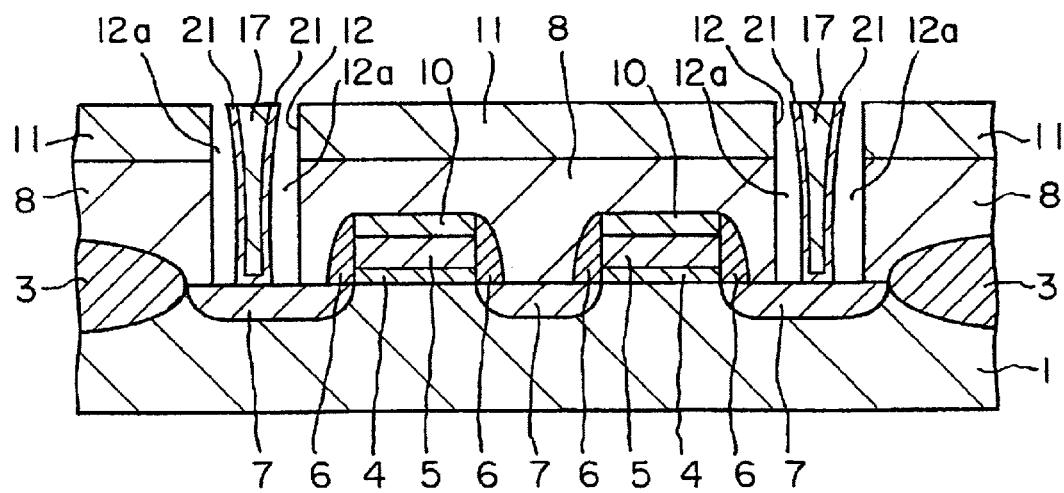
FIG. 8 is a schematic sectional view explaining a step of the embodiment of producing process of the DRAM shown in FIG. 1.

Next, as shown in FIG. 8, a first washing with hydrofluoric acid and then a second washing with heated phosphoric acid are conducted. The first washing removes the silicon oxide film 14 from each storage contact 12 having the silicon nitride film 13 remained both constituting the side wall 15. Then, the second washing removes the silicon nitride film 13 to have a space 12a between the side walls 15 of each storage contact 12 and each storage node electrode 17. Instead of the two-time washing, hydrofluoric acid gas phase washing can be employed to continuously remove the silicon oxide film 14 and the silicon nitride film 13.

Figure 9:
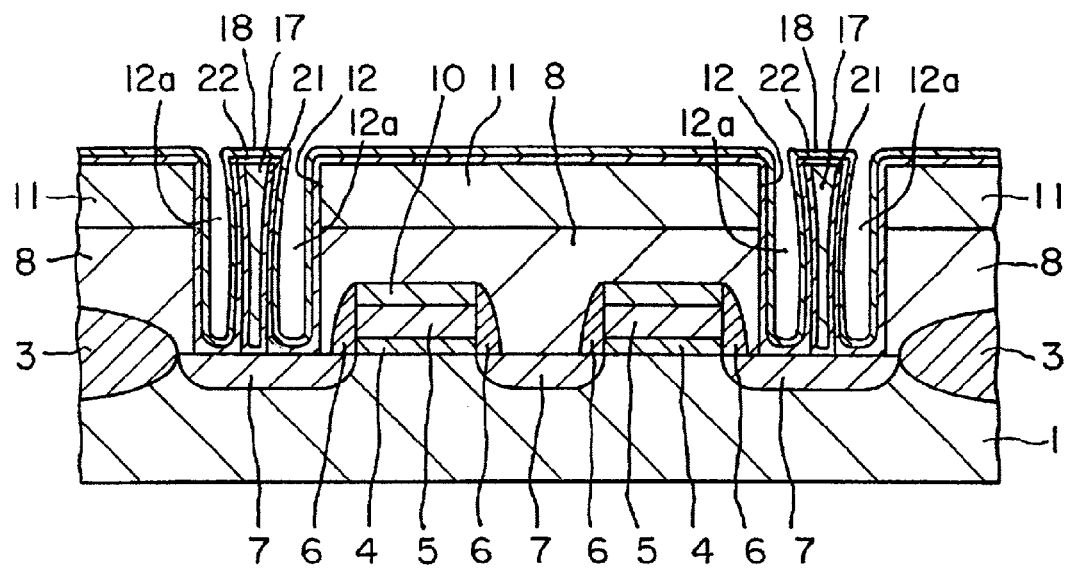
FIG. 9 is a schematic sectional view explaining a step of the embodiment of producing process of the DRAM shown in FIG. 1.

Following to this step, as shown in FIG. 9, a TIN film. 22 is formed with thickness in the range of about 50 nm to 100 nm by sputtering or CVD over the semiconductor substrate 1 including the surface of each space 12a. A high dielectric (ferroelectric) film, such as, a $Ta_2O_5$ film (tantalum oxide film) is deposited with thickness in the range of about 10 nm to 30 nm by CVD to form a capacitive insulating film 18 that covers the surface of each space 12a, that is, the surface of the storage node electrode 17 via TiN film 22 in each storage contact 12 and the inner wall of the storage node electrode 17 via TIN film 22. The capacitive insulating, film 18 may be formed of, instead of $Ta_2O_5$ film, a Perovskite compound, such as $Ba_{1-x}ST_xTiO_3$, or lead zirconate titanate (PZT), that are an insulating film exhibiting high dielectric constant, compared with an ONO film conventionally used as a capacitive insulating film.

Figure 10:
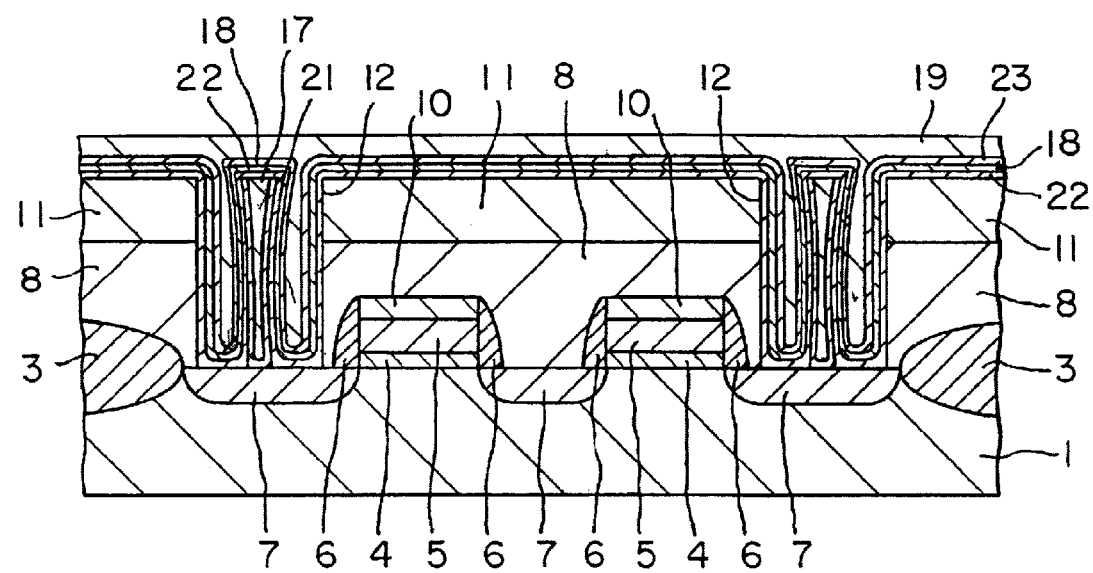
FIG. 10 is a schematic sectional view explaining a step of the embodiment of producing process of the DRAM shown in FIG. 1.

Next, as shown in FIG. 10, by sputtering or CVD, a TiN film 23 is formed with thickness in the range of about 50 nm to 100 nm to cover the capacitive insulating film 18. Following this step, a tungsten film 19 is formed with thickness in the range of about 200 nm to 500 nm by CVD on the inter-layer insulating film 11 to cover the storage node electrode 17 via capacitive insulating film 18 in each storage contact 12 so that each space 12a is filled with the tungsten film 19. A polycrystalline silicon film, for example, can be formed instead of the tungsten film.

Following to this step, photolithography and the succeeding dry etching are applied to the tungsten film 19 to form a cell plate electrode 19 with a specific shape that is an upper electrode of each memory capacitor 200. Through these steps, the memory capacitor 200 with the storage node electrode 17 and the cell plate electrode 19 shown in FIG. 1 is completed in which the electrodes 17 and 19 are connected to each other by capacitive coupling in each storage contact 12.

Thereafter, although not shown, through further steps of forming inter-layer insulating film, contact hole, wiring, peripheral circuitry around the memory cells, and so on, the DRAM shown in FIG. 1 is completed. The peripheral circuitry may be formed with the memory cells.

According to the embodiment, the column-like storage node electrode 17 is formed as it stands in each storage contact 12 formed through the inter-layer insulating film 8 and the flattening layer (the other inter-layer insulating film) 11. And, the high dielectric capacitive insulating layer 18 is formed so as to cover the storage node electrode 17. The column-like storage node electrode 17 is formed as it stands in each storage contact 12 with self-alignment by removing the tungsten film 16 on the flattening layer 11 by etching, etc., no patterning thus being required.

Further, according to the DRAM in the embodiment, the column-like storage node electrode 17 is formed as it stands in each storage contact 12 formed through the inter-layer insulating film 8 and the flattening layer 11. And, the high dielectric capacitive insulating layer 18 is formed so as to cover the storage node electrode 17.

Steps formed between the memory cells and the peripheral circuitry are mainly restricted by the height of the storage node electrodes. In this embodiment, however, such steps are about 50 nm in thickness that almost equals to addition in thickness of the storage node electrode 17 and the cell plate electrode 19 because the electrode 17 is enclosed in each storage contact 12 and hence there is no electrode 17 over the storage contact 12.

This embodiment achieves sufficient step reduction in consideration of 1 $\mu$m in such step thickness in conventional DRAMs. Further, capacitance of a memory capacitor depends on an area in which a storage node electrode and a cell plate electrode face each other via capacitive insulating film, that is, the surface area of the storage node electrode. The storage node electrode 17 of this embodiment exists in each storage contact 12 so that its surface area is relatively small, however, an adequate capacitance is obtained because the inter-layer insulating film 8 is formed of a ferroelectric material, such as, $Ta_2O_5$, $Ba_{1-x}Sr_xTiO_3$ and PZT.

Therefore, the present embodiment achieves less fabrication steps with no complicated patterning, and further reduction of steps formed between memory cells and peripheral circuitry, on the other hand, achieves adequate capacitance of memory capacitors.

Further, according to the DRAM in this embodiment, even further miniaturization and integration will provide small and low memory capacitors to restrict steps, however, obtain adequate capacitance, thus achieving high reliability.

A modification of the embodiment will be explained in detail. The modification is applied to a DRAM the same as the embodiment already described, however, there are some differences in fabrication steps. Elements in this modification that are the same as or analogous to elements of the DRAM of the embodiment described above are referenced by the same reference numerals and will not be explained in detail.

Firstly, the same as the embodiment already described, through the steps show in FIGS. 2 to 7, the tungsten film 16 is formed in each storage contact 12 only to form the storage node electrode 17 with self-alignment this no patterning. The storage node electrode 17 is a lower electrode of each memory capacitor 200 connected to the impurity diffusion layer 7 that is a source in each storage contact 12.

Next, as shown in FIG. 11, washing with hydrofluoric acid is conducted to remove the silicon oxide film 14 from each storage contact 12, on the other hand, to have the silicon nitride film 13, both constituting each side wall 15. Only the silicon nitride film 13 can be remained in each storage contact 12 by adjusting the washing time.

Following to this step, as shown in FIG. 12, a ferroelectric material, such as, a $Ta_2O_5$ film is deposited by CVD with thickness in the range of about 10 nm to 30 nm to form the capacitive insulating film 18 that covers the inner wall of each space 12a, that is, the surface of the storage node electrode 17 in each storage contact 12 and the inner wall of the storage contact 12 via silicon nitride film 13. Since the inter-layer insulating film 8 made of BPSG film or the inter-layer insulating film 11 made of silicon oxide film exhibits low tightness to the $Ta_2O_5$ film, the embodiment already described above forms the $Ta_2O_5$ film via underlayer (TiN) film 22. On the other hand, this modification has the silicon nitride film 13 on the inner wall of each storage contact 12, thus formation of such under-layer (TiN) film 22 being not required, and hence the number of fabrication steps is reduced.

Figure 13:
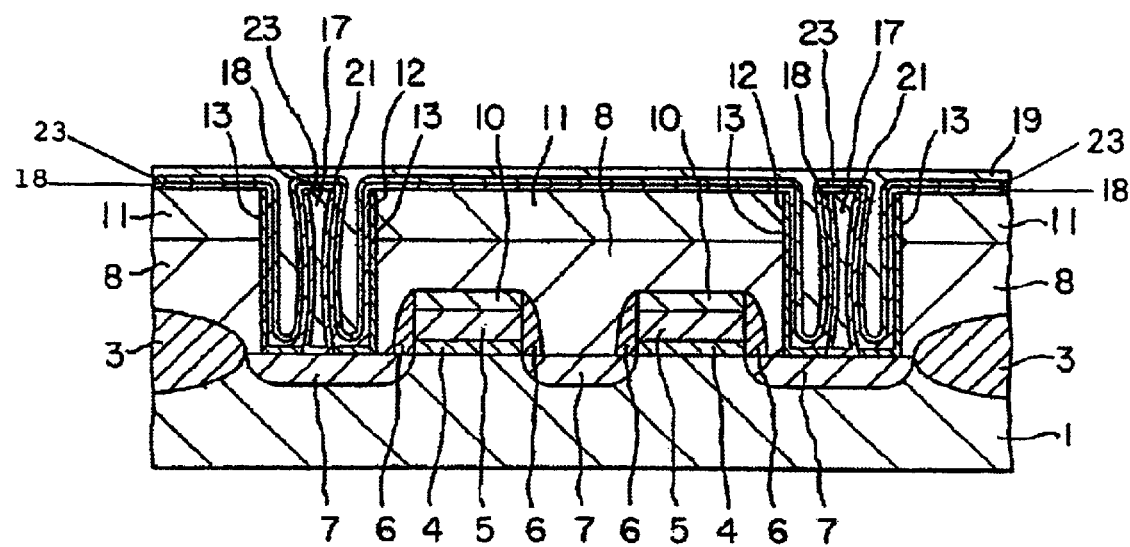
FIG. 13 is a schematic sectional view explaining a step of the modification of producing process of the DRAM shown in FIG. 1.

Next, as shown in FIG. 13, a TiN film 13 is formed by CVD with thickness in the range of about 50 nm to 100 nm over the semiconductor substrate 1 to cover the capacitive insulating film 18. Following to this step, the tungsten film 19 is formed by CVD with thickness in the range of about 200 nm to 500 nm on the flattening layer (inter-layer insulating film) 11 50 that the tungsten film 19 covers the storage node electrode 17 via capacitive insulating film 18 in each storage contact 12, thus the space 12a in each storage contact 12 being filled with the tungsten film 19. A polycrystalline silicon film can be formed instead of the tungsten film 19.

Following to this step, photolithography and the succeeding dry etching are applied to the tungstic film 19 to form a cell plate electrode 19 with a specific shape that is a upper electrode of each memory capacitor 200. Through these steps, the memory capacitors 200 with the storage node electrode 17 and the cell plate electrode 19 shown in FIG. 1 are completed in which the electrodes 17 and 19 are connected to each other by capacitive coupling in each storage contact 12.

Thereafter, although not shown, through further steps of forming inter-layer insulating film, contact hole, wiring, peripheral circuitry around the memory cells, and so on, a DRAM is completed. The peripheral circuitry may be formed with the memory cells.

The same as the embodiment already described, according to the modification, the column-like storage node electrode 17 is formed as it stands in each storage contact 12 formed through the inter-layer insulating film 8 and the flattening layer (the other inter-layer insulating film) 11. And, the high dielectric capacitive insulating layer 18 is formed so as to cover the storage node electrode 17. The column-like storage node electrode 17 is formed as it stands in each storage contact 12 with self-alignment by removing the tungsten film 16 on the flattening layer 11 by etching, etc., no patterning this being required.

Further, according to the DRAM of the modification, the column-like storage node electrode 17 is formed as it stands in each storage contact 12 formed through the inter-layer insulating film 8 and the flattening layer 11. And, the high dielectric capacitive insulating layer is formed so as to cover the storage node electrode 17. Steps formed between the memory cells and the peripheral circuitry are mainly restricted by the height of the storage node electrodes. In this modification, however, such steps are about 50 nm in thickness that almost equals the addition in thickness of the storage node electrode 17 and the cell plate electrode 19 because the electrode 17 is enclosed in each storage contact 12 and hence there is no electrode 17 over the storage contact 12.

This modification achieves sufficient step reduction in consideration of 1 $\mu$m in such step thickness in conventional DRAMs. Further, capacitance of a memory capacitor depends on an area in which a storage node electrode and a cell plate electrode face each other via capacitive insulating film, that is, the surface area of the storage node electrode. The storage node electrode 17 of this embodiment exists in each storage contact 12 so that its surface area is relatively small, however, an adequate capacitance is obtained because the inter-layer insulating film 8 is formed of a ferroelectric material, such as, $Ta_2O_5$, $Ba_{1-x}Sr_xTiO_3$ and PZT.

Therefore, the modification achieves less fabrication steps with no complicated patterning, and further reduction of steps formed between memory cells and peripheral circuitry, on the other hand, achieves adequate capacitance of memory capacitors.

Further, according to the DRAM of the modification, even further miniaturization and integration will provide small and low memory capacitors to restrict steps, however, obtain adequate capacitance, thus achieving high reliability.

The embodiment and the modification are applied to a DRAM of COB configuration, however, without limited to this, they can be applied to a DRAM of capacitor under bitline (CUB) configuration where memory capacitors are formed under the bit lines.

According to the present invention, further miniaturization and integration of semiconductors will provide small and low memory capacitors to restrict steps, however, obtain adequate capacitance, thus achieving high reliability.

What is claimed is:

1. A method of producing a semiconductor memory device provided with at least an access transistor having a gate and a pair of impurity diffusion layers, and at least a memory capacitor having a storage node electrode and a cell plate electrode, the electrodes being connected to each other by capacitive coupling through a dielectric film, the method comprising:

forming a first insulating film that covers the access transistor;

forming a hole by patterning the first insulating film to expose a portion of a surface of one of the pair of the impurity diffusion layers through the hole;

forming a second insulating film that covers an inner side wall of the hole;

forming a first conductive film on the first insulating film so that the hole is filled with the first conductive film on the second insulating film;

having the first conductive film remain in the hole by removing the first conductive film on the first insulating film so that the second insulating film is exposed;

forming the storage node electrode by removing the second insulating film to form a space between the first conductive film and the inner wall of the hole, wherein the first conductive film remains so that the storage node electrode is formed in a shape of a column on the one of the pair of the impurity diffusion layers in the hole, and wherein an upper surface of the column does not extend above a surface of the first insulating film;

forming the dielectric film comprising a ferroelectric material to cover a surface of the storage node electrode;

forming a second conductive film on the first insulating film so that the space in the hole is filled with the second conductive film;

forming a cell plate electrode on the first insulating film so that the cell plate electrode covers the storage node electrode and the dielectric film by patterning the second conductive film; and after the hole forming and before the second insulating film forming, forming a fourth insulating film a material of which is different from a material of the first insulating film, wherein in the second insulating film forming, the second insulating film is formed on the fourth insulating film, and in the storage node electrode forming, the fourth insulating film only remains to directly cover at least one of the pair of impurity diffusion layers of the access transistor.

2. The method according to claim 1, further comprising:

forming, after the second insulating film forming and before the first conductive film forming, a third conductive film to cover at least a surface of the one of the pair of the impurity diffusion layers in the hole; and forming, after the dielectric film forming and before the second conductive film forming, a fourth conductive film to cover the dielectric film.

3. The method according to claim 2, wherein ensuring that the first conductive film remains includes removing the first and third conductive films so as to allow the first and third conductive films to remain in the hole.

4. The method according to claim 3, wherein ensuring that the first conductive film remains in the hole further includes polishing time first and third conductive film by chemical mechanical polishing to expose a portion of the second insulating film.

* * * * *